(12) United States Patent
Wu

(10) Patent No.: US 7,999,359 B2
(45) Date of Patent: Aug. 16, 2011

(54) SEMICONDUCTOR PACKAGE WITH ELECTROMAGNETIC SHIELD

(75) Inventor: Chia-fu Wu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 695 days.

(21) Appl. No.: 12/019,861

(22) Filed: Jan. 25, 2008

(65) Prior Publication Data

US 2008/0179717 A1    Jul. 31, 2008

(30) Foreign Application Priority Data

Jan. 26, 2007    (TW) .............................. 96103080 A

(51) Int. Cl.
*H01L 23/552*    (2006.01)
(52) U.S. Cl. .. 257/659; 257/660; 257/508; 257/E23.114
(58) Field of Classification Search .................... None
See application file for complete search history.

(56) References Cited

U.S. PATENT DOCUMENTS

| 6,919,631 | B1 | 7/2005 | Zoba et al. | |
| 6,933,598 | B2 | 8/2005 | Karnezos | |
| 2005/0288392 | A1 * | 12/2005 | Okubora | 523/176 |

FOREIGN PATENT DOCUMENTS

TW    200639980    11/2006

* cited by examiner

*Primary Examiner* — Minh-Loan T Tran
*Assistant Examiner* — Fei Fei Yeung Lopez
(74) *Attorney, Agent, or Firm* — Tim Tingkang Xia; Morris, Manning & Martin, LLP

(57) ABSTRACT

A semiconductor package with an electromagnetic shield is disclosed. The semiconductor package includes two substrates (102, 202; 103, 203) and an electromagnetic shield (101, 201). Each substrate has at least one die (108, 208; 112, 212) provided thereon. The electromagnetic shield is disposed between the two substrates for shielding electromagnetic interference between adjacent dies of the two substrates. One of the two substrates defines a cavity (109, 209) for partially accommodating the electromagnetic shield. Accordingly, the overall vertical height and the volume of the semiconductor package are not increased, and the heat dissipation efficiency of the semiconductor package is enhanced.

18 Claims, 2 Drawing Sheets

SEMICONDUCTOR PACKAGE WITH ELECTROMAGNETIC SHIELD

BACKGROUND OF THE INVENTION

1. Field of the Invention

The present invention relates to a semiconductor package, and particularly to a semiconductor package incorporating an electromagnetic shield.

2. Description of Prior Art

With the rapid development of electronic industry, electronic products or electrical appliances have become the necessaries of life. However, it is known that the electronic products or electrical appliances in operation produce electromagnetic interference (EMI), which has adverse influences on the stability of the whole electronic device or system. Electromagnetic interference may result in a slight, transient malfunction, failure in function or even damage to the device. It is well known that changing electric currents induce an electric field, and a changing electric field creates a magnetic field. When an electric field is coupled to a magnetic field at right angles to each other, electromagnetic radiations or waves are formed.

Typically, in high-density packaging, multiple dies can be arranged side-by-side or can be stacked vertically within the package to form a system-in-package (SiP). To reduce the electromagnetic interference between the dies in the package, metal traces are generally integrated with the substrate of the package. However, these metal traces may not essentially meet the shielding requirement as desired, and the EMI shielding effect also may be limited due to the density of these metal traces.

Hence, an improved semiconductor package having an electromagnetic shield to provide a more effective EMI shielding capability is desired. It is further desired that this electromagnetic shield should not raise the overall height of the semiconductor package while effectively shielding electromagnetic interference between adjacent dies of the semiconductor package.

SUMMARY OF THE INVENTION

An object of the present invention is to provide a semiconductor package having an electromagnetic shield to effectively shield electromagnetic interference between adjacent dies.

To achieve the above object, according to a first embodiment of the present invention, a semiconductor package is provided, which includes an electromagnetic shield, a first substrate, a second substrate and a plurality of metal balls. The electromagnetic shield defines a first inwardly recessed cavity. The first substrate is stacked over the second substrate, and has a first upper surface with a first die provided thereon and a first lower surface with a second cavity defined therein for partially accommodating the electromagnetic shield. The second substrate has a second upper surface with a second die provided thereon, and a second lower surface.

The electromagnetic shield is disposed above and around the second die with the second die received in the first cavity thereof, whereby the second die is separated from the first die. The second substrate further defines at least one via therethrough. The plurality of metal balls consists of a plurality of conductive metal balls and a plurality of grounding metal balls. The conductive metal balls are provided on the first lower surface of the first substrate and the second lower surface of the second substrate. The conductive metal balls provided on the first lower surface of the first substrate electrically interconnect corresponding circuits on the first and second substrates, and the conductive metal balls provided on the second lower surface of the second substrate serve as an input/output interface of the second substrate to input/output electrical signals from/to an external device such as a motherboard. The grounding metal balls are provided on the second lower surface of the second substrate, and are electrically connected with corresponding vias in the second substrate. A plurality of grounding bumps is exposed in the second cavity of the first substrate to electrically connect with the electromagnetic shield, and the electromagnetic shield is electrically connected with other grounding circuits through the vias and the grounding metal balls. Accordingly, electromagnetic interference between the stacked first and second dies can be effectively avoided, and the stacked vertical height of the semiconductor package is not increased.

The present invention also provides another semiconductor package according to a second embodiment. This embodiment is different from the first embodiment in that the first substrate is provided with at least one die on the first lower surface thereof, not on the first upper surface as in the first embodiment. In addition, the electromagnetic shield of the second embodiment further has a plurality of fins formed on the upper surface thereof to enhance the heat dissipation efficiency.

The semiconductor package in accordance with the present invention achieves the EMI shielding effect by the employment of an electromagnetic shield rather than by the application of conventional metal traces integrated with the substrate. Therefore, a more effective EMI shielding capability can be provided by the present invention because limitations in layout of the metal traces are not encountered by the present invention. Further, the stacked vertical height of the present semiconductor package employing such an electromagnetic shield is not increased while effectively shielding electromagnetic interference between stacked dies.

BRIEF DESCRIPTION OF THE DRAWINGS

The present invention may be best understood through the following description with reference to the accompanying drawings, in which.

DETAILED DESCRIPTION OF THE PREFERRED EMBODIMENTS

Figure 1:
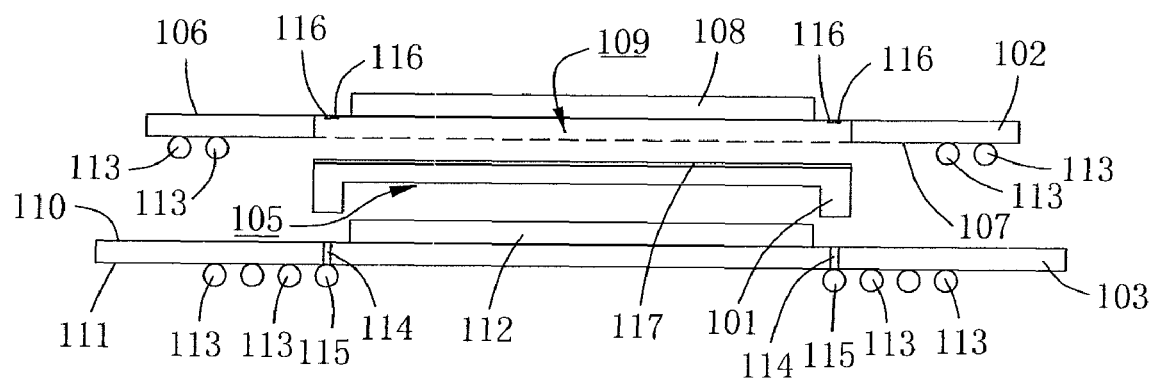
FIG. 1 is a schematic, exploded view of a semiconductor package with an electromagnetic shield in accordance with a first embodiment of the present invention.

Referring to FIG. 1, a semiconductor package in accordance with a first embodiment of the present invention includes an electromagnetic shield 101, a first substrate 102, a second substrate 103, a plurality of conductive metal balls 113 and a plurality of grounding metal balls 115.

The electromagnetic shield 101 defines a first inwardly recessed cavity 105. The first substrate 102 has a first upper surface 106 with a first die 108 provided thereon, and a first lower surface 107 with a second cavity 109 defined therein for partially accommodating the electromagnetic shield 101. The second cavity 109 may be defined either through or not through the first substrate 102. The first die 108 is provided with at least one grounding bump 116 (four shown in FIG. 1) for electrically connecting with the electromagnetic shield 101. The second substrate 103 has a second upper surface 110 with a second die 112 provided thereon and a second lower surface 111. The electromagnetic shield 101 is disposed above and around the second die 112 with the second die 112 received in the first cavity 105, whereby the second die 112 is separated from the first die 108. The second substrate 103 further defines at least one via 114 therethrough (two shown in FIG. 1). The electromagnetic shield 101 is electrically connected with grounding circuits (not shown) through the vias 114 and the grounding metal balls 115. The plurality of conductive metal balls 113 is provided on the first lower surface 107 of the first substrate 102 and the second lower surface 111 of the second substrate 103. The conductive metal balls 113 provided on the first lower surface 107 of the first substrate 102 electrically interconnect corresponding circuits (not shown) on the first and second substrates 102, 103, and the conductive metal balls 113 provided on the second lower surface 111 of the second substrate 103 serve as an input/output interface of the second substrate 103 to input/output electrical signals from/to an external device such as a motherboard. The grounding metal balls 115 are provided on the second lower surface 111 of the second substrate 103, and are electrically connected with corresponding vias 114 in the second substrate 103. The grounding bumps 116 are exposed in the second cavity 109 of the first substrate 102 for electrical connection with the electromagnetic shield 101. The electromagnetic shield 101 is connected with grounding circuits (not shown) of the first die 108 through the grounding bumps 116, and is further connected with other grounding circuits (not shown) through the vias 114 and the grounding metal balls 115. The first substrate 102 is stacked over the second substrate 103 in a manner with the first lower surface 107 thereof facing the second upper surface 110 of the second substrate 103, whereby a semiconductor package of the first embodiment of the present invention is thus constructed. In this semiconductor package, the first die 108 and the second die 112 are disposed substantially in a stacked relationship with respect to one another.

To achieve the EMI shielding purpose, the electromagnetic shield 101 may be made of metal or non-metal materials. The metal materials preferably include high thermal conductive materials such as copper, aluminum, silver and gold. When the electromagnetic shield 101 is made of non-metal materials, a metal shielding layer is coated on at least one surface of the electromagnetic shield 101. Alternatively, the electromagnetic shield 101 may also be constructed of a non-metal material filled with metal particles. The height of the electromagnetic shield 101 is substantially equal to or smaller than the sum of the thickness of the first substrate 102 and the height of the conductive metal balls 113 on the first lower surface 107 of the first substrate 102. A heat dissipation layer 117 may be further selectively provided on the electromagnetic shield 101, that is, between the first die 108 and the electromagnetic shield 101 for enhancing heat dissipation efficiency. The heat dissipation layer 117 is preferably in the form of thermal paste, for example, thermally conductive silver-filled paste.

Figure 2:
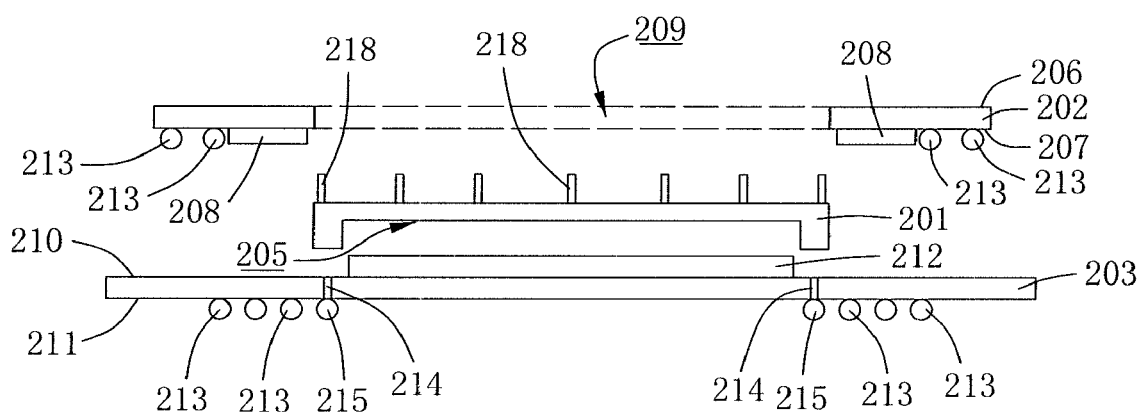
FIG. 2 is a schematic, exploded view of a semiconductor package with an electromagnetic shield in accordance with a second embodiment of the present invention.

Reference is now directed to FIG. 2, which is a schematic, exploded view of a semiconductor package with an electromagnetic shield in accordance with a second embodiment of the present invention. The semiconductor package of the second embodiment includes an electromagnetic shield 201, a first substrate 202, a second substrate 203, a plurality of conductive metal balls 213 and a plurality of grounding metal balls 215.

The electromagnetic shield 201 defines a first inwardly recessed cavity 205. The first substrate 202 has a first upper surface 206 and a first lower surface 207 with at least one first die 208 (two shown in FIG. 2) provided thereon. The first lower surface 207 of the first substrate 202 defines a second cavity 209 therein for partially accommodating the electromagnetic shield 201. The second cavity 209 may be defined either through or not through the first substrate 202. The second substrate 203 has a second upper surface 210 with a second die 212 provided thereon and a second lower surface 211. The electromagnetic shield 201 is disposed above and around the second die 212 with the second die 212 received in the first cavity 205 thereof, whereby the second die 212 is separated from the first die 208. The second substrate 203 further defines at least one via 214 therethrough (two shown in FIG. 2). The grounding metal balls 215 are provided on the second lower surface 211 of the second substrate 203 and are electrically connected with corresponding vias 214 in the second substrate 203. The electromagnetic shield 201 is electrically connected with other grounding circuits (not shown) through the vias 214 and the grounding metal balls 215. The plurality of conductive metal balls 213 is provided on the first lower surface 207 of the first substrate 202 and the second lower surface 211 of the second substrate 203. The conductive metal balls 213 provided on the first lower surface 207 of the first substrate 202 electrically interconnect corresponding circuits (not shown) on the first and second substrates 202, 203, and the conductive metal balls 213 provided on the second lower surface 211 of the second substrate 203 serve as an input/output interface of the second substrate 203 to input/output electrical signals from/to an external device such as a motherboard. The first substrate 202 is stacked over the second substrate 203 in a manner with the first lower surface 207 thereof facing the second upper surface 210 of the second substrate 203, whereby a semiconductor package of the second embodiment of the present invention is thus constructed. In this semiconductor package, the first dies 208 and the second die 212 are arranged substantially in a side-by-side relationship with respect to one another.

In order to enhance heat dissipation efficiency, it is preferred that the second cavity 209 is defined through the first substrate 202 and an upper surface of the electromagnetic shield 201 is thus exposed. A plurality of fins 218 may be selectively provided on the upper surface of the electromagnetic shield 201 to further enhance the heat dissipation efficiency. The plurality of fins 218 preferably projects upwardly away from the first upper surface 206 of the first substrate 202.

As described above, the second embodiment is different from the first embodiment in that the at least one first die 208 of the second embodiment is provided on the first lower surface 207 of the first substrate 202, not on the first upper surface 106 as in the first embodiment. In addition, the electromagnetic shield 201 of the second embodiment has a plurality of fins 218 formed on the upper surface thereof to enhance the heat dissipation efficiency.

In comparison with the conventional design, the semiconductor package in accordance with the present invention effectively shields the electromagnetic interference between adjacent dies by the employment of an electromagnetic shield. Further, the stacked vertical height of the present semiconductor package employing such an electromagnetic shield is not increased while providing a more effective EMI shielding effect. In addition, a heat dissipation layer or a plurality of fins may be additionally provided on the electromagnetic shield to further enhance the heat dissipation efficiency of the present semiconductor package.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A semiconductor package, comprising:
an electromagnetic shield defining a first inwardly recessed cavity;
a first substrate having a first upper surface and a first lower surface, the first upper surface having a first die provided thereon, the first lower surface defining a second cavity partially accommodating the electromagnetic shield;
a second substrate having a second upper surface and a second lower surface and defining at lease one via therethrough, the second upper surface having a second die provided thereon, wherein the electromagnetic shield is grounded through the at least one via; and
a plurality of conductive metal elements provided on the first lower surface of the first substrate and the second lower surface of the second substrate, the conductive metal elements on the first lower surface of the first substrate electrically interconnecting the first substrate with the second substrate, the conductive metal elements on the second lower surface of the second substrate constituting an electrical input/output interface for the second substrate;
wherein the first substrate is stacked over the second substrate, the electromagnetic shield is disposed above the second die to separate the second die from the first die, and the second die is received in the first cavity of the electromagnetic shield.

2. The semiconductor package as claimed in claim 1, wherein the second lower surface of the second substrate comprises a plurality of grounding metal elements provided thereon, the grounding metal elements being electrically connected with the at least one via.

3. The semiconductor package as claimed in claim 1, wherein the electromagnetic shield is made of metal.

4. The semiconductor package as claimed in claim 1, wherein the electromagnetic shield is made of a non-metal material and comprises at least one surface on which a metal shielding layer is provided.

5. The semiconductor package as claimed in claim 1, wherein the electromagnetic shield is made of a non-metal material filled with metal particles.

6. The semiconductor package as claimed in claim 1, wherein the first die is provided with at least one grounding bump for electrically connecting with the electromagnetic shield.

7. The semiconductor package as claimed in claim 1, wherein the electromagnetic shield has a height substantially equal to or smaller than a sum of thickness of the first substrate and height of the conductive metal elements disposed on the first lower surface of the first substrate.

8. The semiconductor package as claimed in claim 1, wherein the electromagnetic shield has a heat dissipation layer provided thereon, the heat dissipation layer being located between the first die and the electromagnetic shield.

9. A semiconductor package, comprising:
an electromagnetic shield defining a first inwardly recessed cavity;
a first substrate having a first upper surface and a first lower surface, the first lower surface having at least one first die provided thereon and defining a second cavity therein, the second cavity partially accommodating the electromagnetic shield;
a second substrate having a second upper surface and a second lower surface, the second upper surface having a second die provided thereon; and
a plurality of conductive metal elements provided on the first lower surface of the first substrate and the second lower surface of the second substrate, the conductive metal elements on the first lower surface of the first substrate electrically interconnecting the first substrate with the second substrate, the conductive metal elements on the second lower surface of the second substrate constituting an electrical input/output interface for the second substrate;
wherein the first substrate is stacked over the second substrate, the electromagnetic shield is disposed above the second die to separate the second die from the first die, and the second die is received in the first cavity of the electromagnetic shield.

10. The semiconductor package as claimed in claim 9, wherein the second substrate defines at least one via therethrough, and the electromagnetic shield is grounded through the at least one via.

11. The semiconductor package as claimed in claim 10, wherein the second lower surface of the second substrate comprises a plurality of grounding metal elements provided thereon, the grounding metal elements being electrically connected with the at least one via.

12. The semiconductor package as claimed in claim 9, wherein the electromagnetic shield is made of metal.

13. The semiconductor package as claimed in claim 9, wherein the electromagnetic shield is made of a non-metal material and comprises at least one surface on which a metal shielding layer is provided.

14. The semiconductor package as claimed in claim 9, wherein the electromagnetic shield is made of a non-metal material filled with metal particles.

15. The semiconductor package as claimed in claim 9, wherein the electromagnetic shield has a height substantially equal to or smaller than a sum of thickness of the first substrate and height of the conductive metal elements disposed on the first lower surface of the first substrate.

16. The semiconductor package as claimed in claim 9, wherein the second cavity is defined through the first substrate, and an upper surface of the electromagnetic shield is exposed.

17. The semiconductor package as claimed in claim 16, wherein the electromagnetic shield comprises a plurality of fins provided on the upper surface thereof.

18. The semiconductor package as claimed in claim 17, wherein the fins of the electromagnetic shield project upwardly away from the first upper surface of the first substrate.

* * * * *